United States Patent
Yoon

(10) Patent No.: US 9,971,780 B2
(45) Date of Patent: May 15, 2018

(54) DATA MANAGEMENT APPARATUS AND METHOD OF ENERGY MANAGEMENT SYSTEM

(71) Applicant: LSIS CO., LTD., Anyang-si, Gyeonggi-do (KR)

(72) Inventor: Yeo Chang Yoon, Seoul (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 425 days.

(21) Appl. No.: 14/476,441

(22) Filed: Sep. 3, 2014

(65) Prior Publication Data

US 2015/0074061 A1    Mar. 12, 2015

(30) Foreign Application Priority Data

Sep. 9, 2013    (KR) .................. 10-2013-0108133

(51) Int. Cl.

| | |
|---|---|
| G06F 17/30 | (2006.01) |
| G06F 11/14 | (2006.01) |
| G06F 17/50 | (2006.01) |
| G06N 99/00 | (2010.01) |
| G01R 19/25 | (2006.01) |
| H02J 13/00 | (2006.01) |

(52) U.S. Cl.
CPC ... *G06F 17/30091* (2013.01); *G01R 19/2513* (2013.01); *G06F 11/1451* (2013.01); *G06F 17/30153* (2013.01); *G06F 17/30569* (2013.01); *G06F 17/5009* (2013.01); *G06N 99/005* (2013.01); *H02J 13/0086* (2013.01)

(58) Field of Classification Search
USPC .......................................... 707/654
See application file for complete search history.

(56) References Cited

U.S. PATENT DOCUMENTS

| 7,383,285 B1* | 6/2008 | Pal .................... G06F 17/30607 |
| 2010/0153064 A1* | 6/2010 | Cormode ................ G06F 17/18 702/179 |
| 2011/0040786 A1 | 2/2011 | Zhang et al. |
| 2013/0204836 A1 | 8/2013 | Choi et al. |

(Continued)

FOREIGN PATENT DOCUMENTS

| JP | 2004-501599 | 1/2004 |
| JP | 2011-065424 | 3/2011 |

(Continued)

OTHER PUBLICATIONS

Korean Intellectual Property Office Application Serial No. 10-2013-0108133, Notice of Allowance dated Jun. 17, 2015, 2 pages.

(Continued)

*Primary Examiner* — Kris Mackes
*Assistant Examiner* — Allen Lin
(74) *Attorney, Agent, or Firm* — K&L Gates LLP

(57) ABSTRACT

A data management apparatus is provided. In the data management apparatus, a real-time database stores data collected from a power system; a power system data recording (PSDR) server reads and stores data stored in the real time database and creates policy data and a data file on the basis of the stored data and a PSDR history file storage unit backs up data processed by the PSDR server.

11 Claims, 4 Drawing Sheets

(56) References Cited

U.S. PATENT DOCUMENTS

| | | | | |
|---|---|---|---|---|
| 2013/0215006 A1* | 8/2013 | Liss | ................. | H04H 60/32 |
| | | | | 345/156 |
| 2013/0275783 A1* | 10/2013 | Liu | ................. | G01R 31/3606 |
| | | | | 713/310 |
| 2013/0317659 A1* | 11/2013 | Thomas | ............ | H04W 52/0216 |
| | | | | 700/286 |

FOREIGN PATENT DOCUMENTS

| | | | | |
|---|---|---|---|---|
| KR | 10-0964298 | 6/2010 | | |
| KR | 10-2013-0086692 | 8/2013 | | |
| KR | 10-2013-0097366 | 9/2013 | | |
| WO | 2013/078541 | 6/2013 | | |
| WO | WO 2013078541 A1 * | 6/2013 | ............ | G06Q 10/04 |

OTHER PUBLICATIONS

Acar, et al., "Framework for large-scale modeling and simulation of electricity systems for planning, monitoring, and securing operations of next-generation electricity grids," IBM Smarter Energy Research, XP055114535, Feb. 2011, 73 pages.

European Patent Office Application Serial No. 14183517.3, Search Report dated Mar. 9, 2015, 7 pages.

Korean Intellectual Property Office Application Serial No. 10-2013-0108133, Office Action dated Mar. 30, 2015, 5 pages.

Korean Intellectual Property Office Application Serial No. 10-2013-0108133, Office Action dated Sep. 30, 2014, 4 pages.

\* cited by examiner

FIG.4

|  | PERIOD 1 | PERIOD 2 | PERIOD 3 | PERIOD 4 | PERIOD 5 |
|---|---|---|---|---|---|
| POINT 1 | 5 | 5 | 6 | 5 | 5 |
| POINT 2 | 10 | 11 | 12 | 10 | 11 |
| POINT 3 | 15 | 14 | 14 | 15 | 15 |
| POINT 4 | 20 | 20 | 19 | 18 | 18 |
| POINT 5 | 25 | 25 | 26 | 26 | 24 |

(a)

PERIOD 1 + POINT 1, 5, POINT 2, 10, POINT 3, 15, POINT 4, 20, POINT 5, 25

PERIOD 2 + POINT 1, 5, POINT 2, 11, POINT 3, 14, POINT 4, 20, POINT 5, 25

PERIOD 3 + POINT 1, 6, POINT 2, 12, POINT 3, 14, POINT 4, 19, POINT 5, 26

PERIOD 4 + POINT 1, 5, POINT 2, 10, POINT 3, 15, POINT 4, 18, POINT 5, 26

PERIOD 5 + POINT 1, 5, POINT 2, 11, POINT 3, 15, POINT 4, 18, POINT 5, 24

(b)

PERIOD 1 + POINT 1, 5, POINT 2, 10, POINT 3, 15, POINT 4, 20, POINT 5, 25

PERIOD 2 + POINT 2, 11, POINT 3, 14

PERIOD 3 + POINT 1, 6, POINT 2, 12, POINT 4, 19, POINT 5, 26

PERIOD 4 + POINT 1, 5, POINT 2, 10, POINT 3, 15, POINT 4, 18

PERIOD 5 + POINT 2, 11, POINT 5, 24

(c)

DATA MANAGEMENT APPARATUS AND METHOD OF ENERGY MANAGEMENT SYSTEM

CROSS-REFERENCE TO RELATED APPLICATIONS

Pursuant to 35 U.S.C. § 119(a), this application claims the benefit of earlier filing date and right of priority to Korean Patent Application No. 10-2013-0108133, filed on Sep. 9, 2013, the contents of which are all hereby incorporated by reference herein in its entirety.

BACKGROUND

The present disclosure relates to an apparatus and method for efficiently storing power system data for data reproduction in an energy management system. The energy management system obtaining large amount of data in real time is an apparatus for collecting power system data, monitoring and controlling the collected data.

The energy management system may detect whether an incident occurs in data obtained from the power system and grasp causes of the incident through a process of simulating a situation at that time in order to analyze the causes of the incident.

In order to reproduce an incident that may occur in the energy management system, a dispatcher training simulator (DTS) requires real time power system data at that time and all measured data and operation data obtained by the energy management system are stored in real time at each scan period.

Since the power system data to be stored in real time is of a large amount, it is not easy to search for data to be substantially used or an overload may occur in a storage system. In addition, since it is possible to check only a history of stored data, when an incident occurs in the power system, there are limits in a detailed analysis of states and data in order to analyze the incident.

SUMMARY

Embodiments provide a data management apparatus and method of an energy management system for efficiently storing and managing data obtained from a power system.

Embodiments also provide a data management apparatus and method in an energy management system according to pre-processing and management for data obtained from a power system.

In one embodiment, a data management apparatus includes: a real-time database storing data collected from a power system; a power system data recording (PSDR) server reading and storing data stored in the real time database and creating policy data and a data file on the basis of the stored data; and a PSDR history file storage unit backing up data processed by the PSDR server.

In another embodiment, a data management system includes: an energy management server storing data collected from a power system and creating policy data and a data file on the basis of the stored data; a historical data management system backing up data created and processed by the energy management server; a dispatcher training server receiving data of the energy management server, which is backed up from the historical data management system, and controlling data creation and operation for executing dispatcher training; and a dispatcher training unit executing dispatcher training simulation on the basis of data applied from the dispatcher training server and collecting result information.

In further another embodiment, a data management method includes: creating a list of measurement data received from a power system; creating policy data on the basis of the created measurement data list; collecting static and dynamic data at each predetermined period from the power system; comparing the collected data and previously collected data; and as the comparison result, when the collected data does not match the previously collected data, adding corresponding data to a dynamic data obtaining list, wherein the policy data is formed in a Value+Tag+Flag format, where the Value denotes a measured value in the power system, the Tag denotes a data control operation signal designated by a user, and the Flag denotes a state of the Value.

The details of one or more embodiments are set forth in the accompanying drawings and the description below. Other features will be apparent from the description and drawings, and from the claims.

BRIEF DESCRIPTION OF THE DRAWINGS

FIG. 4 is an exemplary view for explaining a data processing operation according to an embodiment.

DETAILED DESCRIPTION OF THE EMBODIMENTS

Reference will now be made in detail to the embodiments of the present disclosure, examples of which are illustrated in the accompanying drawings.

Terms and words used herein should not be construed limitedly by the common and dictionary meanings, but should be interpreted by meaning and concepts conforming to the technical idea of this invention based on the principle that the concept of terms and words can be defined properly by the inventor in order to describe this invention in the best ways.

Therefore, it should be understood that since the configurations of the embodiments and drawings described herein are merely exemplary embodiments of the present invention, but do not include all the technical spirits of the present invention, there may be provided various equivalents and modifications which can be substituted for the above configurations.

Figure 1:
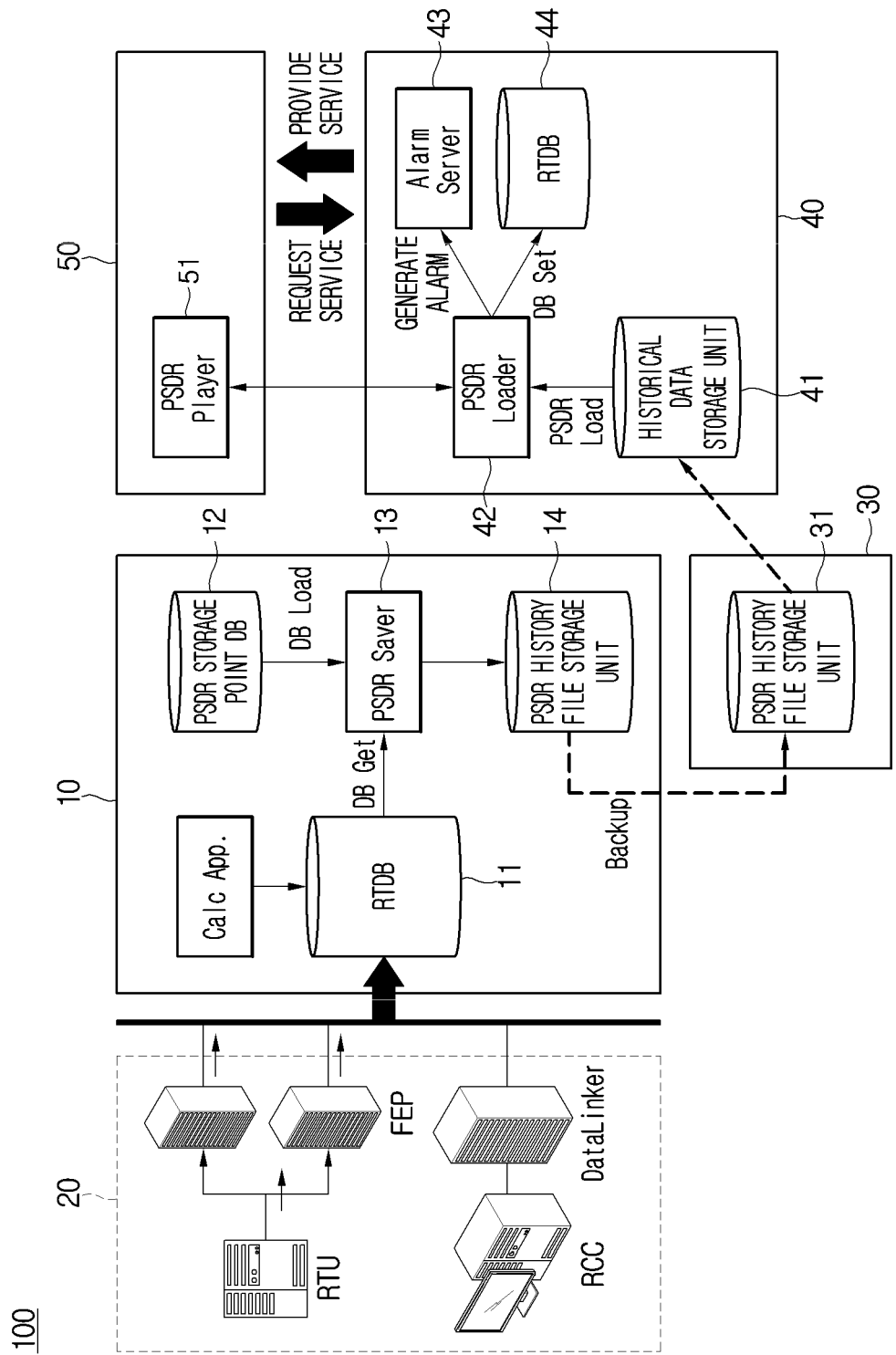
FIG. 1 is a block configuration diagram of an energy management system to which an embodiment is applied.

FIG. 1 is a block configuration diagram of an energy management system to which an embodiment is applied.

Referring to FIG. 1, an energy management system 100 to which the embodiment is applied may include an energy management server 10, a historical data management system (HDMS) 30, a dispatcher training server 40, and a dispatcher training unit 50.

The energy management server 10 may include a real-time database (RTDB) 11, a point database 12, a power system data recording (PSDR) server 13, and a PSDR history file storage unit 14.

The RTDB 11 may collect/store measurement data received from a power system 20 and store operation data based on the measurement data at each predetermined period.

The point database 12 may automatically create and store a list of measurement and operation data, and store a policy data list.

The PSDR server 13 may store data stored in RTDB 11 at each predetermined scan period. The PSDR server 13 may execute file creation and storing only first one time for static data like policy data. The PSDR server 13 may create a data file formed in a data value+Tag+Flag format at each reference time on the basis of policy data preset for the data collected from the power system 20.

Figure 2:
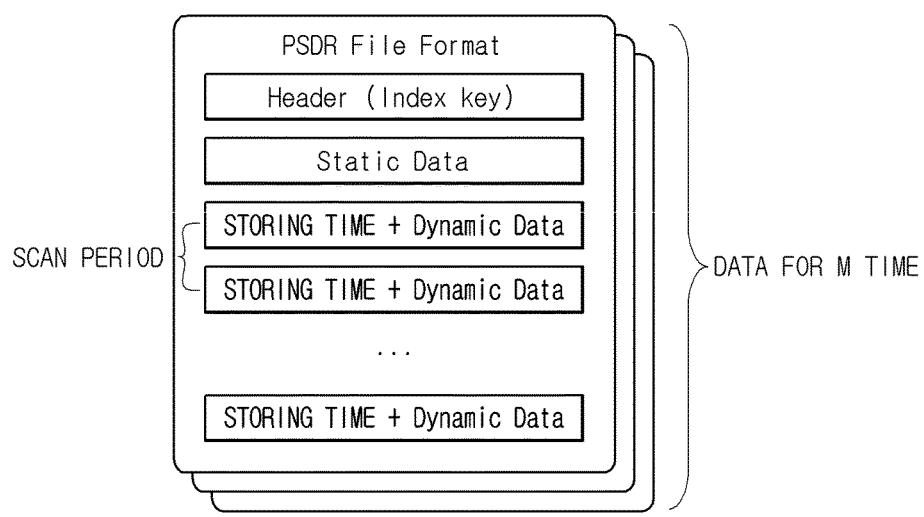
FIG. 2 is an exemplary data file format according to an embodiment.

The format of the data file, as illustrated in FIG. 2, may allow the data file to be distinguished with an index key in a header, and may include fixed data and dynamic data stored at each predetermined period.

The index key is a key value used in a database of the energy management system, and may include a logic unit such as Class, Object, Attribute, Method, and Item. The index key may include a combination of numerals and dots (.), for example, 411.1.101.5.5. Alternatively, it may be replaced with a Name key according to a combination of points and colons (:). For example, Building.FirstFloor.WH001.WH:PV may represent a measurement value (PV, point value) of a meter No. 1 (WH001) on a first floor (FirstFloor) in a building (Building). The PSDR server 13 may obtain measurement values through an Index key conversion in the Name Key. Accordingly, for the Name Key, a file may be created and stored by using a pre-converted Index Key.

In addition, in the PSDR file format, data included in a body is scanned at each predetermined period and formed in a Value+Tag+Flag format.

As described above, the Value represents a specific value measured in an actual power system.

The Tag is that a user designates a specific Tag to a value of Value. For example, when the user manually designates a value, which is not measured data, to the corresponding Value, a Manual Tag may be included. Furthermore, a Tag prohibiting a warning and alarm according to the corresponding Value may be allowed to be included. When a point having the corresponding Value is a controllable point, a control prohibition Tag may be inserted.

The Flag represents a state of the point having the corresponding Value. The Flag may store whether the corresponding value is an initial state or whether data is normally obtained from a power device.

The PSDR history file storage unit 14 may store and back up data processed or created by the PSDE server 13 at each predetermined period (scan period).

The HDMS 30 may execute a backup for data created or processed by the energy management server 10.

The dispatcher training server 40 may receive the backed up data of the energy management server 10 from the HDMS 30 and control data creation and operation for executing dispatcher training.

The dispatcher training server 40 may include a historical data storage unit 41, a PSDR loader 42, an alarm server 43, and a RTDB 44.

The dispatcher training server 40 may allow the dispatcher training unit 50 to check historical data and select an incident section, and may provide data for executing dispatcher training, control an alarm output, and conduct an alarm according to training results of the dispatcher training unit 50.

Figure 3:
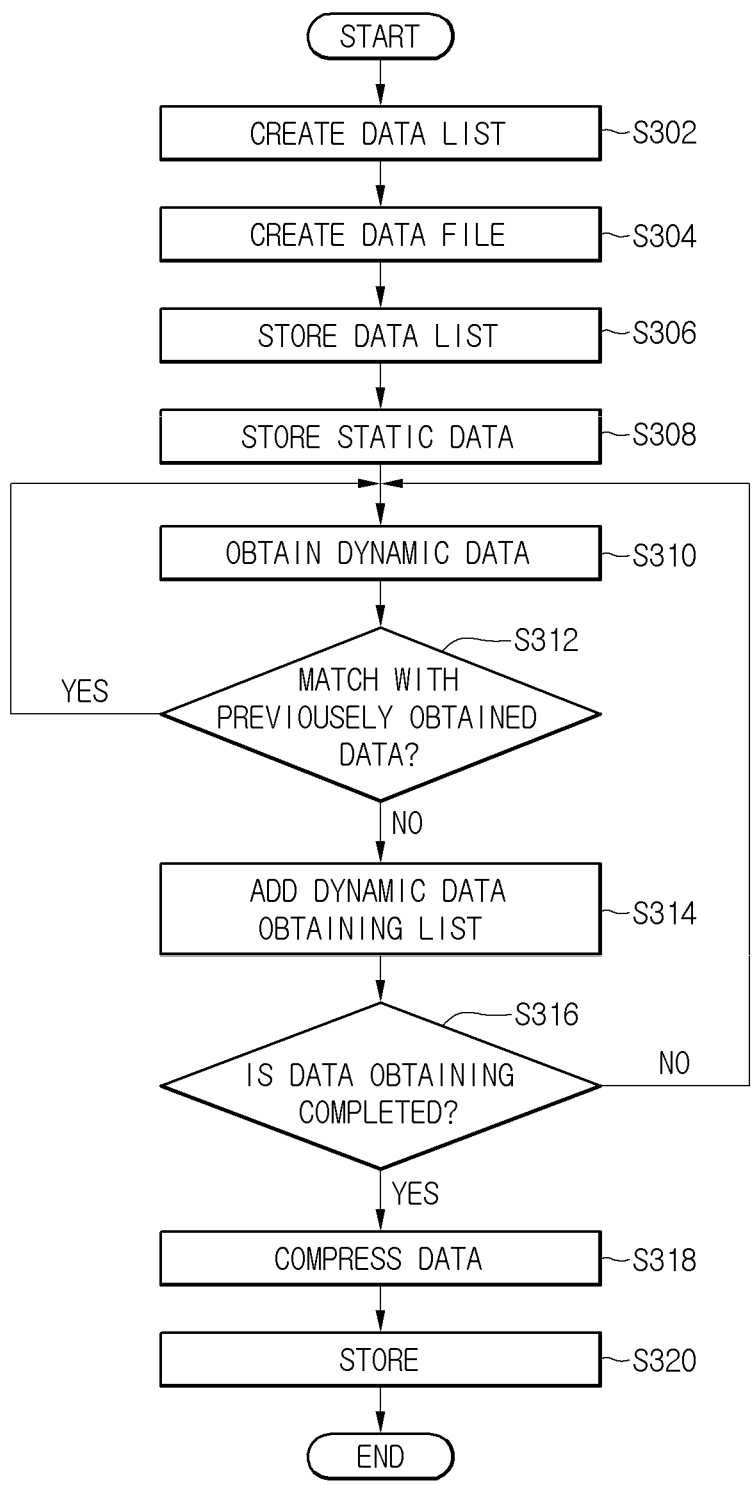
FIG. 3 is a flow chart of a data processing operation according to an embodiment.

FIG. 3 is an operation flow chart of a data processing operation according to an embodiment. FIG. 4 is an exemplary view for explaining a data processing operation according to an embodiment.

Referring FIGS. 3 and 4, the energy management server 10 may create a list of measurement data received from the power system 20 (operation S302), and create a data file like policy data on the basis of the created measurement data list (operation S304).

The energy management server 10 may store the created data list and data file in the point database 12.

The energy management server 10 may obtain static data at each predetermined scan period from the power system 20 and store them (operation S308). In other words, the energy management server 10 may collect identification information or fixedly maintained data among data collected from the power system 20.

Thereafter, the energy management server 10 may collect dynamic data at each predetermined period (operation S310). The energy management server 10 may collect dynamic data values from each point (for example, first to fifth points) of the power system 20 at first and fifth periods or more as shown in table of FIG. 4a. Here, the energy management server 10 may compare the collected dynamic data with data previously obtained and stored, and determine whether there are replicated (matched) data (operation S312). For example, as shown in table of FIG. 4a, for data collected at each period, it is determined whether there are replicated data at each point.

The energy management server 10 stores data values of points having varied data values with the exclusion of the replicated data with reference to data obtained at each period in a data list (operation S314).

In other words, as in table of FIG. 4b, data values are not stored in a existing scheme of storing data values corresponding to each point at each period, but, as in table of FIG. 4c, only data values for periods and points corresponding to varied data values are stored when the data corresponding to points do not vary at each period.

The energy management server 10 may determine whether data obtaining is completed (operation S316), and perform data compression for data values not replicated at each point when the data obtaining is completed or at a predetermined period (operation S318).

The compressed data may be backed up in the energy management server 10 and the HDMS 30. In addition, corresponding data may be read according to a request from the dispatcher training server 40 and output to the dispatcher training server 40 or the dispatcher training unit 50.

According to the embodiments, power system data collected from an energy management system can be efficiently stored and managed, and accordingly causes of incidents in the power system can be easily analyzed and a driving load of the energy management system can be reduced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An energy management system comprising:
   a real-time database configured to store data collected from a power system;

a power system data recording (PSDR) server configured to:
 read and store data stored in the real time database at a predetermined period,
 obtain policy data only once at a first collection time by collecting fixedly maintained data among the data collected from the power system,
 create a data list at each predetermined period on the basis of the stored data in the PSDR server based on the policy data, and
 create a data file based on the data list; and
a PSDR history file memory configured to:
 back up data processed by the PSDR server, and
 output the backed up data of the PSDR history file to a dispatcher training server,
wherein the dispatcher training server includes a historical data storage unit and an alarm server, the dispatcher training server configured to:
receive, by the historical data storage unit, the backed up data of the PSDR history file;
determine a result based on an executed dispatcher training, and
initiate, by the alarm server, an alarm according to the result of the executed dispatcher training,
wherein the data file is formed in a Value+Tag+Flag format, where the Value denotes a measured value in the power system, the Tag denotes a data control operation signal designated by a user, and the Flag denotes a state of the Value, and
the data file comprises fixed data and dynamic data stored at each period for allowing the data file to be distinguished with an index key in the header,
wherein the PSDR server is further configured to compare the collected dynamic data with previously collected data values and only store the collected dynamic data when collected dynamic data values are varied compared to previously collected data values.

2. The system according to claim 1, wherein the PSDR history file memory is further configured to back up data processed by the PSDR server at each predetermined period.

3. The system according to claim 1, wherein the index key is formed of a logic unit comprising Class, Object, Attribute, Method, and Item.

4. The system according to claim 1, wherein the PSDR server is further configured to compress and store the created data list when data collected from the power system is completed.

5. The system according to claim 1, wherein the PSDR server is further configured to compress and store the data list created from the power system at a predetermined period.

6. The system according to claim 1, further comprising a pointer database configured to automatically create and store a list of measurements and operation data, and store a policy data list.

7. The system according to claim 1, wherein, for data collected from the power system, the PSDR server stores only corresponding data of a corresponding period when data values corresponding to each point are varied.

8. An energy management method comprising:
creating a list of measurement data received from a power system;
creating a data file comprising fixed data and dynamic data stored at each period for allowing the data file to be distinguished with an index key in the header;
creating policy data only once at a first collection time by collecting fixedly maintained measurement data of the created measurement data list;
collecting fixed data and dynamic data at each predetermined period from the power system;
comparing the collected dynamic data and previously collected data;
storing the collected dynamic data to the list only when the collected dynamic data values are varied compared to previously collected data values as the comparison result;
backing up the stored data;
outputting the backed up data to a dispatcher training server, wherein the dispatcher training server controls operation for executing dispatcher training using the backed up data; and
outputting an alarm according to a result of the executed dispatcher training,
wherein the policy data is formed in a Value+Tag+Flag format, where the Value denotes a measured value in the power system, the Tag denotes a data control operation signal designated by a user, and the Flag denotes a state of the Value.

9. The method according to claim 8, wherein, when the collected dynamic data does not match pre-stored and previously collected data, only data values of points having varied data values are stored with exclusion of replicated data.

10. The method according to claim 8, wherein, when the data collection is completed, corresponding data is compressed and stored.

11. The method according to claim 10, wherein the data compression is performed on data values which are not replicated and correspond to each point.

* * * * *